United States Patent [19]
Endo

[11] Patent Number: 5,168,175
[45] Date of Patent: Dec. 1, 1992

[54] SEMICONDUCTOR INTEGRATED CIRCUIT USING JUNCTION FIELD EFFECT TRANSISTOR AS CURRENT CONTROL ELEMENT

[75] Inventor: Koichi Endo, Tokyo, Japan

[73] Assignee: Kabushiki Kaisha Toshiba, Kawasaki, Japan

[21] Appl. No.: 654,807

[22] Filed: Feb. 13, 1991

[30] Foreign Application Priority Data

Feb. 21, 1990 [JP] Japan ................................. 2-40352

[51] Int. Cl.$^5$ ............................................ H03K 3/353
[52] U.S. Cl. ................................. 307/304; 307/305; 307/548; 307/554
[58] Field of Search ............... 307/304, 305, 548, 554

[56] References Cited

U.S. PATENT DOCUMENTS

| 3,633,044 | 1/1972 | Buckstad | 307/304 |
| 4,937,469 | 6/1990 | Larson et al. | 307/304 |

FOREIGN PATENT DOCUMENTS 62-272631 11/1987 Japan ................................. 307/304

Primary Examiner—Eugene R. LaRoche
Assistant Examiner—R. A. Ratliff
Attorney, Agent, or Firm—Finnegan, Henderson, Farabow, Garrett and Dunner

[57] ABSTRACT

A semiconductor integrated circuit for obtaining constant voltage characteristics or a current switching function by controlling an output current using a current control element has a DC input terminal, a common input/output terminal, and an output terminal. A junction field effect transistor (JFET) is used as a current control element. The first main electrode (drain) and second main electrode (source) of the JFET are connected to the DC current input terminal and the output terminal, respectively. A DC power is input between the DC input terminal and the common input/output terminal. A power between the output terminal and the common input/output terminal is applied to a load. A maximum current of the JFET is limited to a drain maximum saturation current and a current having a value larger that of the maximum saturation current is not basically supplied to the JFET.

14 Claims, 5 Drawing Sheets

SEMICONDUCTOR INTEGRATED CIRCUIT USING JUNCTION FIELD EFFECT TRANSISTOR AS CURRENT CONTROL ELEMENT

BACKGROUND OF THE INVENTION

1. Field of the Invention

The present invention relates to a semiconductor integrated circuit (IC) for obtaining constant voltage characteristics or a current switching function by controlling an output current and, more particularly, to an IC using a junction field effect transistor (JFET) as a current control element.

2. Description of the Related Art

As a conventional IC for obtaining constant voltage characteristics or a current switching function by controlling an output current, a constant voltage power source IC (three-terminal voltage regulator), a switching IC, or the like is known. The constant voltage power source IC has an input terminal, an output terminal, and a common input/output terminal (in many cases, a ground terminal). A current supplied from the output terminal is adjusted by a current control element, and an output voltage generated between the output terminal and the ground terminal (common input/output terminal) is kept constant. As the current control element, an npn bipolar transistor is used. The output voltage is monitored using an error amplifier (differential amplifier). A voltage generated between the output and ground terminals and divided by a resistor is applied to one input terminal of the error amplifier, and a reference voltage output from a reference voltage source provided in the IC is applied to the other input terminal. The output from the error amplifier is fed back to the control input terminal of the current control element (the base of the npn bipolar transistor), thereby keeping the output voltage constant. When a load is connected between the output and ground terminals, if a load resistance is decreased by some reason while the IC is operated at a constant voltage, the voltage between the output and ground terminals is decreased. When the decrease in voltage is detected by the error amplifier, the output voltage of the error amplifier is increased so as to increase a base current of the npn bipolar transistor. As a result, a current supplied to the load resistor is increased, and the voltage between the output and ground terminals which is decreased is increased up to a predetermined voltage and stabilized. As the conventional constant voltage power source IC, a TA7805S, a TA78L05S, a TA79005S, and the like manufactured by TOSHIBA CORP. are commercially available.

A constant voltage power source IC in which a metal oxide semiconductor field effect transistor (MOSFET) is used in place of the npn bipolar transistor of the conventional constant voltage power source IC is known. The operation of this IC follows that of the constant voltage power source IC using the above bipolar transistor.

In the above constant voltage power source IC, when the output and ground terminals are short-circuited or almost short-circuited with each other, an overcurrent is supplied to a current control element (bipolar transistor or MOSFET), and the element is overheated and may break down. For this reason, a protection circuit is incorporated to detect the overcurrent to interrupt an output when a load current having a value larger than a predetermined value is supplied. A resistor for detecting an overcurrent is connected in series with the current control element, and an overcurrent having a value larger than a predetermined value is supplied to the resistor. At this time, the overcurrent protection circuit is operated to set the current control element to an OFF state, thereby preventing the element from being damaged.

A conventional switching IC for ON/OFF-control of an output current is arranged as follows. The switching IC has a power source input terminal, an output terminal, a common input/output terminal (ground terminal), and a control signal input terminal. A current control element (n-p-n bipolar transistor) is ON/OFF-controlled by an internal control circuit in response to a control signal supplied from the control signal input terminal. As this switching IC, a TA8057S manufactured by TOSHIBA CORP. is commercially available.

Also in the switching IC, when a load connected between the output and ground terminals is decreased by some reason and an overcurrent results, the element may be damaged. For this reason, as in a constant voltage power source IC, an overcurrent having a value larger than a predetermined value is detected by some method so as not to apply the overcurrent to the current control element. Therefore, a protection circuit consisting of, e.g., a resistor for detecting an overcurrent and an overcurrent protection circuit is generally incorporated in the switching IC.

However, the above overcurrent protection circuits are not required for essential circuit operations such as a stabilizing operation of a voltage or an ON/OFF operation of a current supply. Especially in an IC for treating a small amount of current, since another protection circuit must be added to a chip originally having a small area, the circuit becomes complicated, and the chip area is increased.

SUMMARY OF THE INVENTION

It is, therefore, an object of the present invention to provide a semiconductor integrated circuit, for obtaining constant voltage characteristics or a current switching function by controlling an output current, capable of protecting a current control element from damage due to an overcurrent without providing an overcurrent protection circuit.

In order to achieve the above object of the present invention, there is provided a semiconductor integrated circuit for obtaining constant current characteristics or a current switching function by controlling an output current, comprising a DC input terminal, a common input/output terminal, an output terminal, and a junction field effect transistor having a first main electrode connected to the DC input terminal and a second main electrode connected to the output terminal, wherein a DC power is input between the DC input terminal and the common input/output terminal, and a power between the output terminal and the common input/output terminal is applied to a load.

The junction field effect transistor (JFET) serves as an output current control element of the semiconductor integrated circuit. A maximum current supplied to the JFET is limited to a drain maximum saturation current, and a current having a value larger than that of the maximum current is not basically supplied to the JFET. Therefore, for example, even when the load is short-circuited, since the maximum current supplied to the JFET is limited to the drain maximum saturation current, no overcurrent protection circuit is required, and the JFET is protected from damage due to the overcurrent. As a result, the circuit arrangement is simplified, and pattern area can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
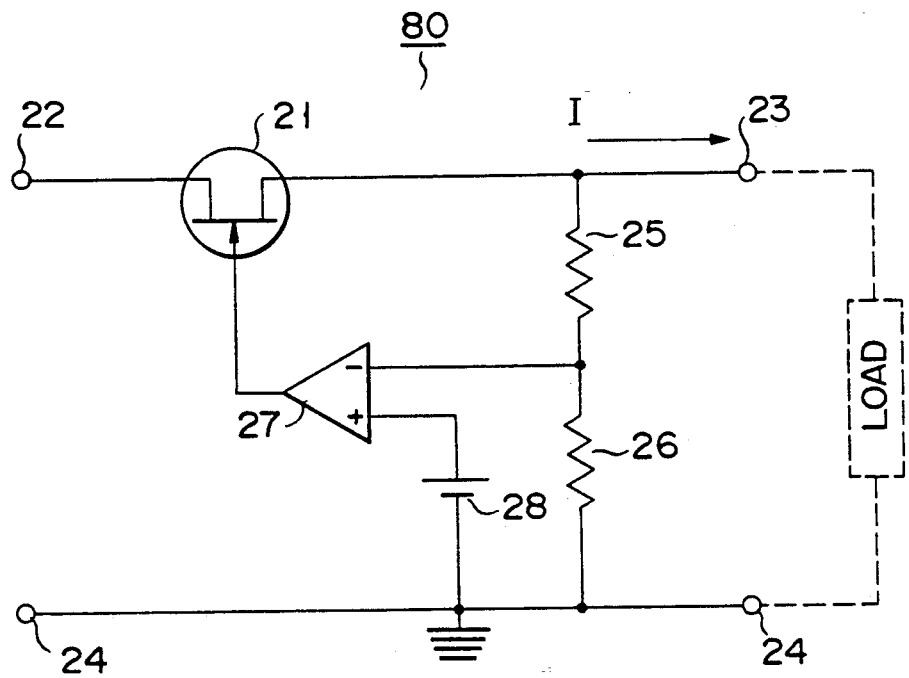
FIG. 1 is a circuit diagram showing a semiconductor integrated circuit (constant voltage power source IC for outputting a positive voltage) according to the first embodiment of the present invention.

Embodiments of the present invention will be described below with reference to the accompanying drawings. FIG. 1 is a circuit diagram showing an arrangement wherein the present invention is applied to a constant voltage power source IC for outputting a positive voltage.

A constant voltage power source IC 80 (an output voltage is set to be 5 V and an output current is set to be 100 mA) has a pair of DC input terminals 22 and 24 to which a DC power is applied and a pair of output terminals 23 and 24 for supplying a power to a load. In this embodiment, the terminal 24 is used as a common input/output terminal (ground terminal) and grounded. As a current control element of the IC 80, an n-channel junction field effect transistor (n-channel JFET) 21 is employed in place of a bipolar transistor or a MOSFET. The input terminal 22 and the output terminal 23 are connected to the drain and source of the JFET 21, respectively. An output voltage across the pair of output terminals 23 and 24 is divided by resistors 25 and 26. An error amplifier (differential amplifier) 27 applies a signal voltage which is proportional to a difference between a reference voltage of a reference voltage source 28 and the voltage divided by the resistors 25 and 26 to the gate of the JFET 21. Therefore, the drain current of the JFET 21 is decreased to maintain a constant voltage between the output terminals 23 and 24.

Figure 2:
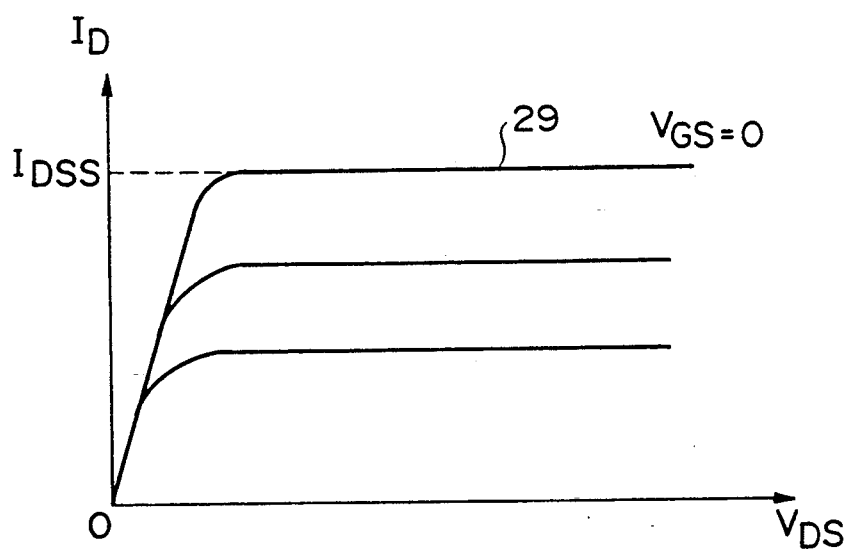
FIG. 2 is a graph for explaining a relationship ($V_{DS}$-$V_D$ characteristics) between a drain-source voltage $V_{DS}$ and a drain current $I_D$ of a junction field effect transistor in the circuit shown in FIG. 1.

FIG. 2 shows a graph of $V_{DS}$ (drain-source voltage) - $I_D$ (drain current) characteristics of the n-channel JFET 21 shown in FIG. 1. In FIG. 2, the abscissa and the ordinate denote the drain current $I_D$ and the drain-source voltage $V_{DS}$, respectively. A parameter of curves in FIG. 2 is $V_{GS}$ (gate-source voltage), and curve 29 is a characteristic curve when "$V_{GS}=0$ V". As is apparent from FIG. 2, the maximum value of the drain current $I_D$ is limited to a maximum saturation current $I_{DSS}$ when "$V_{GS}=0$ V". For this reason, a drain current having a value larger than that of the maximum saturation current $I_{DSS}$ is not basically supplied to the JFET 21. As a result, in the circuit in FIG. 1, even when the output terminals 23 and 24 are short-circuited to each other, an output current I having a value larger than that of the maximum saturation current $I_{DSS}$ is not supplied. Therefore, the current control element (JFET) 21 has the same function as a protection circuit, even when a current protection circuit is not provided. In addition, since the JFET 21 is a voltage drive element, current consumption can be limited to be lower than a case wherein a bipolar transistor is used as a current control element.

Figure 3:
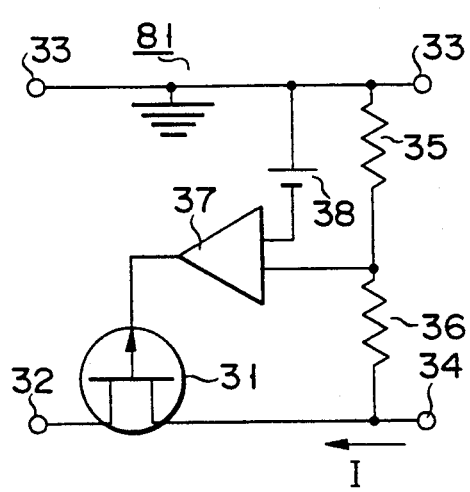
FIG. 3 is a circuit diagram showing a semiconductor integrated circuit (constant voltage power source for outputting a negative voltage) according to the second embodiment of the present invention.

FIG. 3 is a circuit diagram showing an arrangement wherein the present invention is applied to a constant voltage power source IC 81 for outputting a negative voltage. A p-channel JFET 31 is used in place of the n-channel JFET 21 used in the positive voltage output IC 80, and negative current voltage characteristics can be obtained. That is, the constant voltage power source IC 81 has a pair of DC input terminals 33 and 32 to which a DC power is applied and a pair of output terminals 33 and 34 for applying a power to a load. The terminal 33 is a common input/output terminal (ground terminal) and grounded. The input terminal 32 and the output terminal 34 are connected to the source and drain of the JFET 31, respectively. An output voltage between the pair of output terminals is divided by resistors 35 and 36. An error amplifier 37 supplies a signal voltage which is proportional to a difference between a reference voltage of a reference voltage source 38 and the voltage divided by the resistors 35 and 36 to the gate of the JFET 31. A drain current of the JFET 31 is decreased to maintain a constant negative voltage between the output terminals 33 and 34.

In the above arrangement shown in FIG. 3, since the output current I (which is a current supplied from the output terminal 34 in practice) from the output terminal 34 is limited to the maximum saturation current $I_{DSS}$ of the JFET 31, an overcurrent protection circuit is not required.

Figure 4:
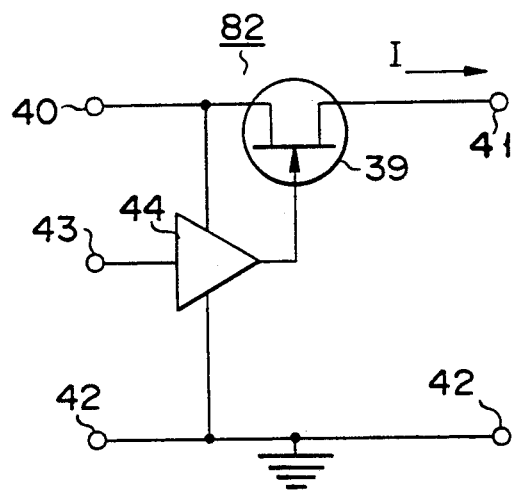
FIG. 4 is a circuit diagram showing a semiconductor integrated circuit (switching IC) according to the third embodiment of the present invention.

FIG. 4 is a circuit diagram showing a case wherein the present invention is applied to a switching IC. A switching IC 82 has a pair of DC input terminals 40 and 42 and a pair of output terminals 41 and 42. The terminal 42 is grounded to a common input/output terminal (ground terminal). The input terminal 40 and the output terminal 41 are connected to the drain and source of an n-channel JFET 39. A buffer circuit 44 is operated by a voltage between the input terminal 40 and the ground terminal 42 and ON/OFF-controls the JFET 39 on the basis of a control signal supplied to a control signal input terminal 43. Therefore, an output current I issued from the output terminal 41 is controlled. Since the maximum value of the output current I corresponds to a maximum saturation current $I_{DSS}$ of the JFET 39, an overcurrent protection circuit is not required.

Figure 5:
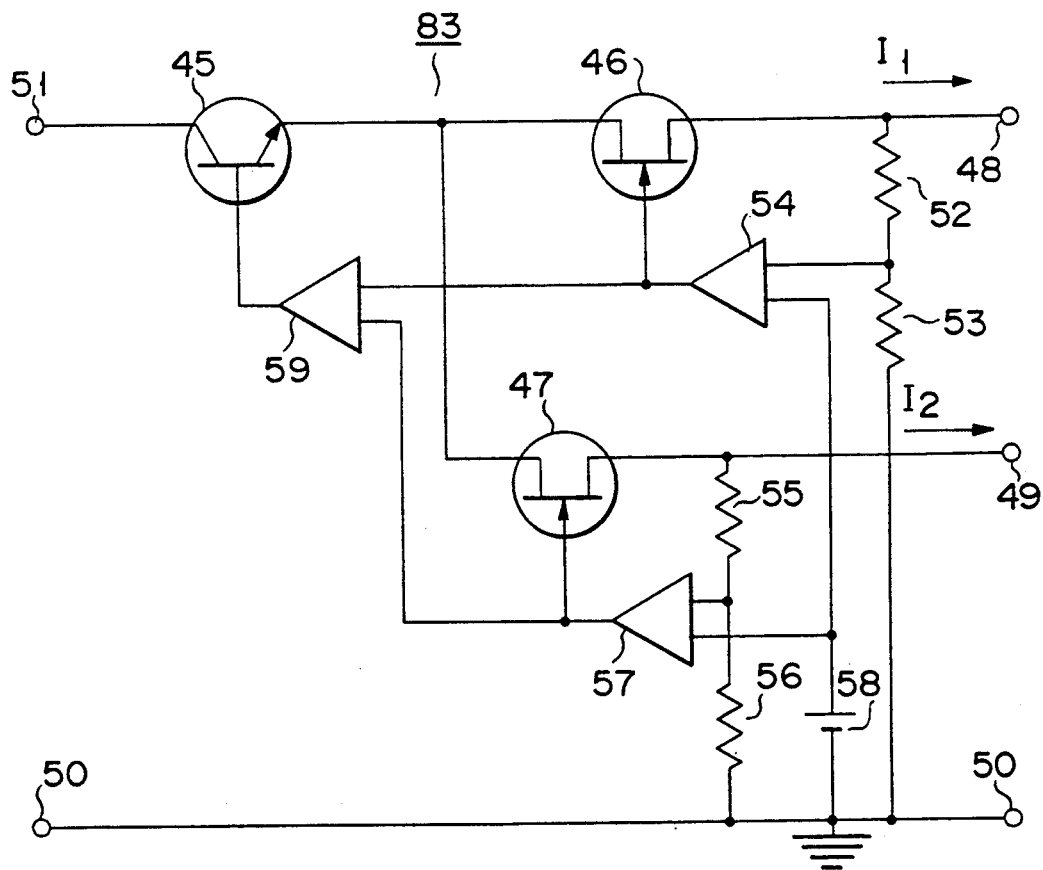
FIG. 5 is a circuit diagram showing a semiconductor integrated circuit (constant voltage power source IC having two outputs) according to the fourth embodiment of the present invention.

FIG. 5 is a circuit diagram showing a constant voltage power source IC having two pairs of output terminals. This constant voltage power source IC 83 has a pair of input terminals 51 and 50, a pair of output terminals 48 and 50, and a pair of output terminals 49 and 50. The terminal 50 is a common terminal (ground terminal) used for the input and the two outputs, and it is grounded. The IC 83 includes an n-p-n bipolar transistor (main current control element) 45, JFETs 46 and 47, error amplifiers 54, 57, and 59, resistors 52, 53, 55, and 56, and a reference voltage source 58. The drains of the JFETs 46 and 47 are connected to the emitter of the transistor 45. The input terminal 51 is connected to the collector of the transistor 45. The output terminals 48 and 49 are connected to the sources of the JFETs 46 and 47, respectively. A first output voltage generated between the pair of output terminals 48 and 50 is divided by the resistors 52 and 53, and a second output voltage generated between the pair of output terminals 49 and 50 is divided by the resistors 55 and 56. The voltage divided by the resistors 52 and 53 is compared with a reference voltage from the reference voltage source 58 by an error amplifier 54, and the voltage divided by the resistors 55 and 56 is compared with the reference voltage from the reference voltage source 58 by an error amplifier 57. An output from the error amplifier 54 is fed back the gate of the JFET 47, and a voltage between the output terminals 49 and 50 is controlled to maintain predetermined stable voltage. Outputs from the error amplifiers 54 and 57 are supplied to an error amplifier 59, and an output from the error amplifier 59 is supplied to the base of the transistor 45.

In this circuit, since the resistivity of the dividing resistors 52 and 53 is different from that of the dividing resistor 55 and 56, different output voltages can be obtained. The maximum current values of currents $I_1$ and $I_2$ supplied from the JFETs 46 and 47 are limited to a maximum saturation current $I_{DSS1}$ of the JFET 46 and a maximum saturation current $I_{DSS2}$ of the JFET 47, respectively. Therefore, a current having a value larger than the maximum currents ($I_{DSS1}$30 $I_{DSS2}$) is not supplied to the npn bipolar transistor (main current control element) 45. Therefore, as in the above embodiments, an overcurrent protection circuit is not required.

Figure 6:
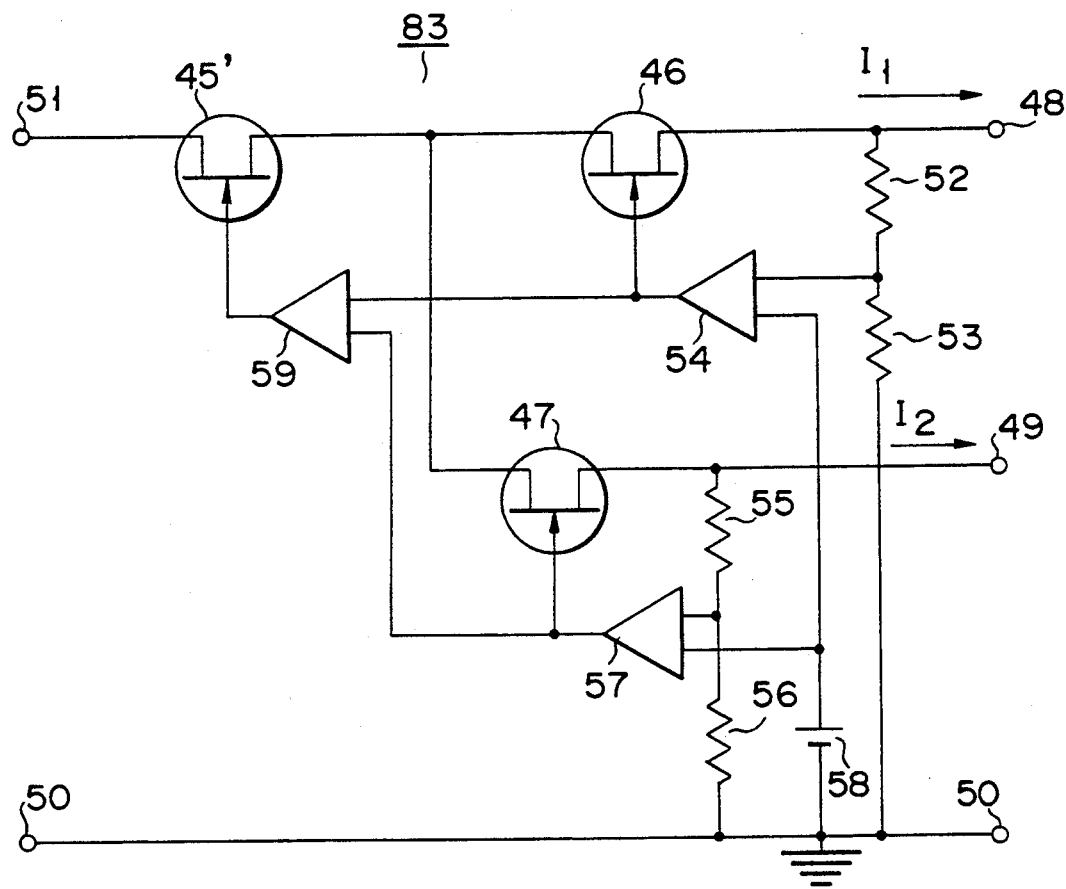
FIG. 6 is a circuit diagram showing a semiconductor integrated circuit (constant voltage power source IC having two outputs) according to the fifth embodiment of the present invention.

As shown in FIG. 6, a JFET 45' may be used as the main current control element in a circuit shown in FIG. 5.

Figure 9:
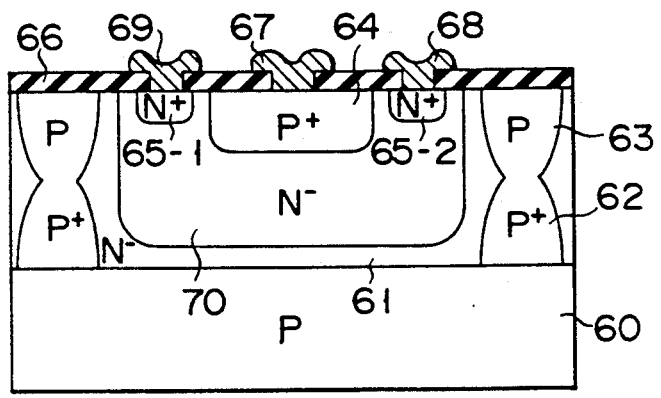
Figure 10:
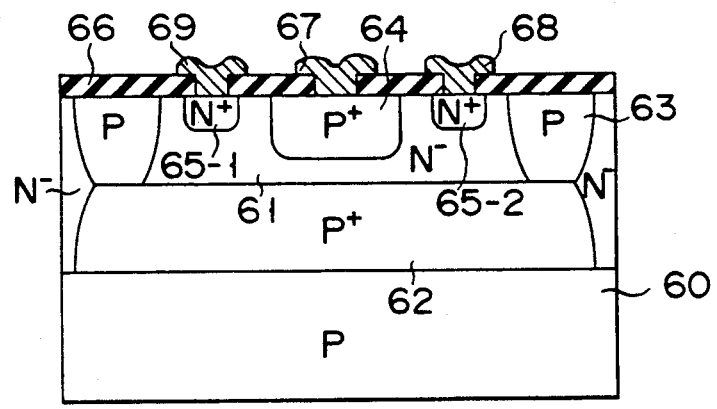
Figure 11:
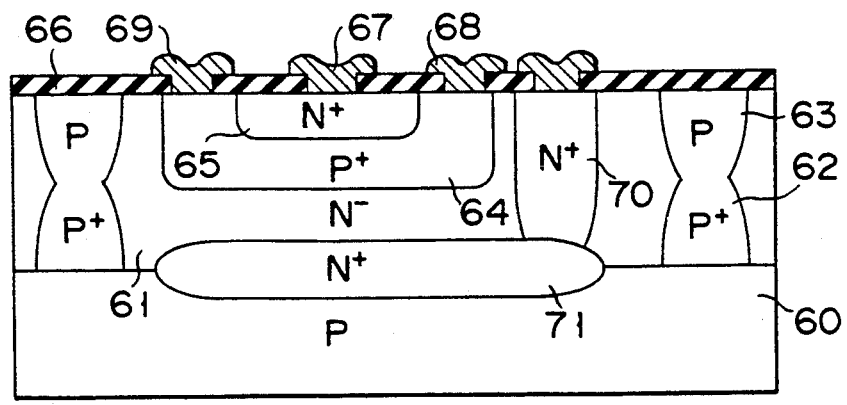

FIGS. 7 to 11 are sectional views showing arrangements of the JFETs used in the above embodiments. These JFETs have a structure which can be formed using a manufacturing process of a conventional bipolar transistor. FIGS. 6 to 10 are sectional views showing an arrangement of an n-channel JFET, and FIG. 11 is a sectional view showing an arrangement of a p-channel JFET. Note that, the same reference numerals as in FIGS. 7 to 11 denote the same parts in FIGS. 7 to 11.

Figure 7:
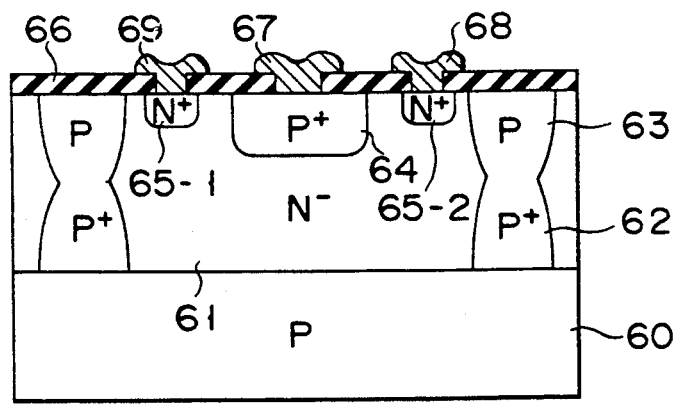
FIGS. 7 to 11 are sectional views for explaining an arrangements of the JFETs in the circuits described in the first to fifth embodiments.

In a JFET shown in FIG. 7, an $n^-$-type epitaxial layer 61 is used as a channel portion, an $n^+$-type impurity diffusion region 65 formed in the same process as that of the emitter of an npn bipolar transistor is used as a source/drain region, and a $p^+$-type impurity diffusion region 64 used for base diffusion and a p-type semiconductor substrate 60 constituting the lower surface of the JFET are used as a gate portion. That is, the $n^-$-type epitaxial layer 61 is formed on the p-type semiconductor substrate 60. In the epitaxial layer 61, $p-$ and $p^+$-type isolation regions 62 and 63 are formed, thereby isolating elements. In the major surface region of the epitaxial layer 61, $n^+$-type impurity diffusion layers 65-1 and 65-2 each having an impurity concentration higher than that of the epitaxial layer 61 are formed to be separated from each other. In the major surface region of the epitaxial layer 61 between the $n^+$-type impurity diffusion regions 65-1 and 65-2, a $p^+$-type impurity diffusion region 64 having an impurity concentration higher than that of the substrate 60 is formed to be separated from the regions 65-1 and 65-2. An insulating film 66 is formed on the resultant structure. Holes are formed in parts of the regions 65-1, 65-2, and 64 of the insulating film 66. A drain electrode 69, a source electrode 68, and a gate electrode 67 are formed in the regions 65-1, 65-2, and 64 respectively.

Figure 8:
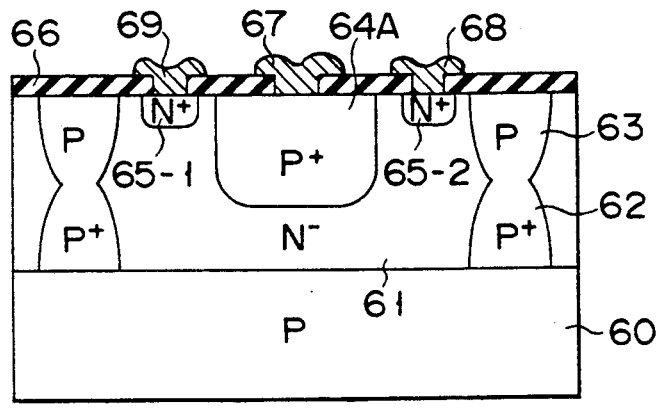

In a JFET shown in FIG. 8, the $p^+$-type impurity diffusion region 64 in FIG. 7 is formed to be deep. Ion implantation is performed twice to the same region to form a deep $p^+$-type impurity region 64A. As a result, the channel portion of the JFET is formed to be narrow. When the channel portion is formed to be narrow, a pinch-off state can be obtained by slightly extending a depletion layer, i.e., by a low gate voltage. That is, a voltage required for controlling the JFET can be decreased.

In a JFET shown in FIG. 9 an $n^+$-type impurity diffusion region 70 formed by deeply diffusing an impurity in the epitaxial layer 61 is used as a channel portion. The region 70 is formed in the same step as that of formation of a deep impurity diffusion region contacting an $n^+$-type buried layer in the manufacturing process of a bipolar IC. Thus, a channel resistance can be decreased.

In a JFET shown in FIG. 10, channel narrowing performed in FIG. 9 is achieved by forming a $p^+$-type buried layer 62 in an epitaxial layer 61 near a junction interface between a substrate 60 and the epitaxial layer 61, thereby substantially decreasing the thickness of the $n^-$-type epitaxial layer 61.

In a JFET shown in FIG. 11, the $p^+$-type impurity diffusion region 64 for diffusing a base upon formation of a bipolar transistor is used as a channel portion. The $n^+$-type impurity diffusion region 65 used for emitter diffusion, an $n^+$-type buried layer 71, and the deep $n^+$-type impurity diffusion region 70 contacting an $n^+$-type buried layer 71 are used as a gate portion.

Note that, in the constant voltage power source ICs shown in FIG. 1, 3, 5, and 6, the error amplifiers 27, 37, 54, and 57, and the reference voltage sources 28, 38, and 58 may be constituted by JFETs or MOSFETs. When these circuits are constituted by the JFETs or MOSFETs, internal power consumption can be further decreased. As described above, the buffer circuit 44 of the switching IC shown in FIG. 4 may be constituted by JFETs or MOSFETs.

Even when the semiconductor integrated circuit described in each embodiment described above is formed on one semiconductor substrate (chip) with not only a constant voltage power source IC or a switching IC but also other semiconductor integrated circuits, the same effect as described above can be obtained. In addition, the semiconductor integrated circuit can be applied as an element of a hybrid integrated circuit.

As described above, according to the present invention, in a semiconductor integrated circuit for obtaining constant voltage characteristics or a current switching function by controlling an output current, a junction field effect transistor, a maximum current value of which is limited to a maximum saturation current, is used as a current control element. As a result, an overcurrent is limited without providing an overcurrent protection circuit, i.e., without complicating a circuit or causing an increase in pattern area, thus preventing a current control element from damage.

What is claimed is:

1. A semiconductor integrated circuit comprising:
   DC input terminal means for receiving DC power;
   common input/output terminal means for receiving DC power and for supplying power to a load;
   output terminal means for supplying power to said load;
   a junction field effect transistor having a first main electrode connected to said DC input terminal means and a second means electrode connected to said output terminal means;
   output voltage sensing means for sensing at least a portion of a voltage between said output terminal means and said common input/output terminal means to provide a sensed output voltage;
   reference voltage generating means for generating a reference voltage; and
   error amplifying means for comparing said sensed output voltage and said reference voltage and for generating a control signal controlling ON/OFF operation of said junction field effect transistor on the basis of the comparison.

2. A circuit according to claim 1, wherein said common input/output terminal means is connected to a ground potential.

3. A circuit according to claim 1, wherein said output voltage sensing means includes dividing means for dividing said voltage between said output terminal means and said common input/output terminal means to provide said sensed output voltage.

4. A circuit according to claim 3, wherein said dividing means includes first and second load elements connected in series between said output terminal means and said common input/output terminal means, said load elements providing said sensed output voltage at a terminal connecting said first and second load elements.

5. A circuit according to claim 4, wherein each of said first and second load elements includes at least one resistor.

6. A circuit according to claim 1, wherein said error amplifying means includes an error amplifier.

7. A semiconductor integrated circuit comprising:
   DC input terminal means for receiving DC power;
   first output terminal means for supplying power to a first load;
   second output terminal means for supplying power to a second load;
   common input/output terminal means for receiving DC power and for supplying power to said first and second loads;
   a semiconductor current control element having a first electrode and a second electrode, said first electrode being connected to said DC input terminal means;
   a first junction field effect transistor having a first electrode connected to said second electrode of said semiconductor current control element and a second electrode connected to said first output terminal means;
   a second junction field effect transistor having a first electrode connected to said second electrode of said semiconductor current control element and a second electrode connected to said second output terminal means;
   first output voltage sensing means for sensing at least a portion of a voltage between said first output terminal means and said common input/output terminal means to provide a first sensed output voltage;
   second output voltage sensing means for sensing at least a portion of a voltage between said second output terminal means and said common input/output terminal means to provide a second sensed output voltage;
   reference voltage generating means for generating a reference voltage;
   first error amplifying means for comparing said first sensed output voltage to said reference voltage and for generating a first control signal controlling ON/OFF operation of said first junction field effect transistor on the basis of the comparison of said first sensed output voltage and said reference voltage;
   second error amplifying means for comparing said second sensed output voltage to said reference voltage and for generating a second control signal controlling ON/OFF operation of said second junction field effect transistor on the basis of the comparison of said second sensed output voltage and said reference voltage; and
   third error amplifying means for comparing said first and second control signals and for generating a third control signal controlling ON/OFF operation of said semiconductor current control element on the basis of said comparison of said first and second control signals.

8. A circuit according to claim 7, wherein said semiconductor current control element is a bipolar transistor.

9. A circuit according to claim 7, wherein said semiconductor current control element is a junction field effect transistor.

10. A circuit according to claim 7, wherein said common input/output terminal means is connected to a ground potential.

11. A circuit according to claim 7, wherein:
   said first output voltage sensing means includes first dividing means for dividing said voltage between said first output terminal means and said common input/output terminal means to provide said first sensed output voltage, and
   said second output voltage sensing means includes second dividing means for dividing said voltage between said second output terminal means and said common input/output terminal means to provide said second sensed output voltage.

12. A circuit according to claim 11, wherein each of said first and second dividing means includes first and second load elements connected in series between the respective output terminal means and said common input/output terminal means, said load elements providing said sensed output voltage at a terminal connecting said first and second load elements.

13. A circuit according to claim 12, wherein each of said first and second load elements includes at least one resistor.

14. A circuit according to claim 7, wherein each of said error amplifying means includes an error amplifier.

* * * * *